United States Patent [19]

McLean

[11] Patent Number: 5,569,957
[45] Date of Patent: Oct. 29, 1996

[54] LOW INDUCTANCE CONDUCTOR TOPOGRAPHY FOR MOSFET CIRCUIT

[75] Inventor: Thomas R. McLean, Mountain Top, Pa.

[73] Assignee: Harris Corporation, Melbourne, Fla.

[21] Appl. No.: 332,300

[22] Filed: Oct. 31, 1994

[51] Int. Cl.$^6$ ............................ H01L 23/52; H01L 23/48; H01L 23/053; H01L 23/12
[52] U.S. Cl. ........................ 257/691; 257/690; 257/693; 257/700; 257/731
[58] Field of Search ............................ 257/690, 691, 257/693, 700, 731

[56] References Cited

U.S. PATENT DOCUMENTS

| | | | |
|---|---|---|---|
| 5,038,197 | 8/1991 | Satriano | 257/691 |
| 5,424,579 | 6/1995 | Arai et al. | 257/691 |

*Primary Examiner*—Steven H. Loke
*Attorney, Agent, or Firm*—Charles E. Wands

[57] ABSTRACT

Lead inductance of a power MOSFET circuit layouts is effectively reduced a 'vertically' parallel terminal lead configuration that serves to cancel magnetic flux linkage between adjacent leads, thereby reducing the effective inductance in terminal leads to the gate, source and drain regions of the circuit. Rather than lay out source, drain and gate terminal leads in long, meandering shapes without regard to their direction or mutual coupling effects, as in conventional structures, source and drain leads are arranged as vertically parallel pair of generally flat conductors, that overlie one another on opposite sides of a thin strip of insulating material. Because of the substantially identical vertical geometry projection of these generally flat conductors upon one another on opposite sides of a thin strip of insulating material, forward and return current through the flat conductors are caused to be in close proximity with each other, thereby effecting magnetic flux linkage cancellation and significantly reducing the effective inductance of the source and drain conductors. Similarly, gate conductor and a source Kelvin leads of a like flat shape are disposed on opposite sides of another thin insulating stripe, which is mounted at a location of a support substrate spaced apart from the mounting location of the source—drain laminate structure. Direct wire bonding may be employed to electrically connect the flat conductors to the MOSFET device.

15 Claims, 2 Drawing Sheets

5,569,957

LOW INDUCTANCE CONDUCTOR TOPOGRAPHY FOR MOSFET CIRCUIT

FIELD OF THE INVENTION

The present invention relates in general to integrated circuit architectures and is particularly directed to a new and improved conductor topography for a power MOSFET circuit configuration that effectively reduces the effective inductance in terminal leads to the gate, source and drain regions of the MOSFET circuit.

BACKGROUND OF THE INVENTION

FIG. 1 diagrammatically illustrates the integrated circuit layout of a conventional power (MOSFET) circuit, having a cascode (series) arrangement of a pair of MOSFET devices M1 and M2, which are capable of extremely fast switching times. A schematic equivalent of the dual MOSFET circuit layout of FIG. 1 is shown in FIG. 2. In such a layout, the physical geometries of terminal connection leads to the source and drain (or collector and emitter equivalents of the schematic of FIG. 2), shown at E2, C1 and C2E1, are relatively long, widely spaced, and extend at right angles to the semiconductor surface area where the internal component regions of the MOSFETs are disposed. As a consequence, such a terminal connection geometry inherently possesses substantial inductance, both mutual and self, which causes unwanted coupling, feedback and noise sensitivity among the source, drain and gate leads.

More particularly, in order to take advantage of the power MOSFET switching speed of such a device, gate charge must be supplied at a high rate. With the use of a voltage source as a common gate drive expedient, an inductive back voltage is induced in the gate lead, which slows switching speed. Another problem is the tendency of parallel arranged MOSFETs to oscillate, particularly if the gate drive conductors are arranged such that they encircle or surround the high current source/drain leads, causing positive feedback coupling.

SUMMARY OF THE INVENTION

In accordance with the present invention, these problems of conventional MOSFET circuit layouts are effectively remedied by a 'vertically' parallel terminal lead configuration that serves to cancel magnetic flux linkage between adjacent leads, thereby reducing the effective inductance in terminal leads to the gate, source and drain regions of the circuit.

For this purpose, rather than lay out the source, drain and gate terminal leads in long, meandering shapes without regard to their direction or mutual coupling effects, as in conventional structures described above with reference to FIGS. 1 and 2, the present invention arranges the source and drain leads, on the one hand, as a vertically parallel pair of generally flat conductors, that overlie one another on opposite sides of a thin strip of insulating material, such as a relatively narrow stripe-shaped ceramic layer. Because of the substantially identical vertical geometry projection of these generally flat conductors upon one another on opposite sides of a thin strip of insulating material, forward and return current through the flat conductors are caused to be in close proximity with each other, thereby effecting magnetic flux linkage cancellation and significantly reducing the effective inductance of the source and drain conductors.

In a similar fashion to the source and drain conductors, flat gate conductor and a source Kelvin leads of a like flat shape are disposed on opposite sides of another thin insulating stripe. The laminate structure of the flat gate conductor, thin insulating stripe and source Kelvin conductor is mounted at a location of a support substrate spaced apart from the mounting location of the source—drain laminate structure, so as to provide a surface mount area on the substrate for the MOSFET devices (integrated circuit die) to which the flat parallel conductors of the two sets of laminate structures are to be connected. As with the parallel source/drain flat conductor arrangement, the close proximity of the flat gate lead and the source Kelvin lead cancels flux linkage therebetween.

Direct bonding of fine copper wires and the like may be employed to electrically connect respective source and drain regions of one or more MOSFET devices to the source and drain conductors of the source/drain mounting strip, to connect gates of the MOSFETs to the gate conductor of the gate/source Kelvin mounting strip, and to connect the source Kelvin conductor on the gate/source mounting strip to the source conductor layer on the source/drain mounting strip.

DETAILED DESCRIPTION

The parallel terminal lead configuration of the present invention for an integrated circuit layout, such as a power MOSFET circuit, for reducing the effective inductance in terminal leads to the device (e.g. gate, source and drain regions) by canceling magnetic flux linkage between leads, will now be described with reference to the various diagrammatic top, side and end views of FIGS. 3–11.

Figure 1:
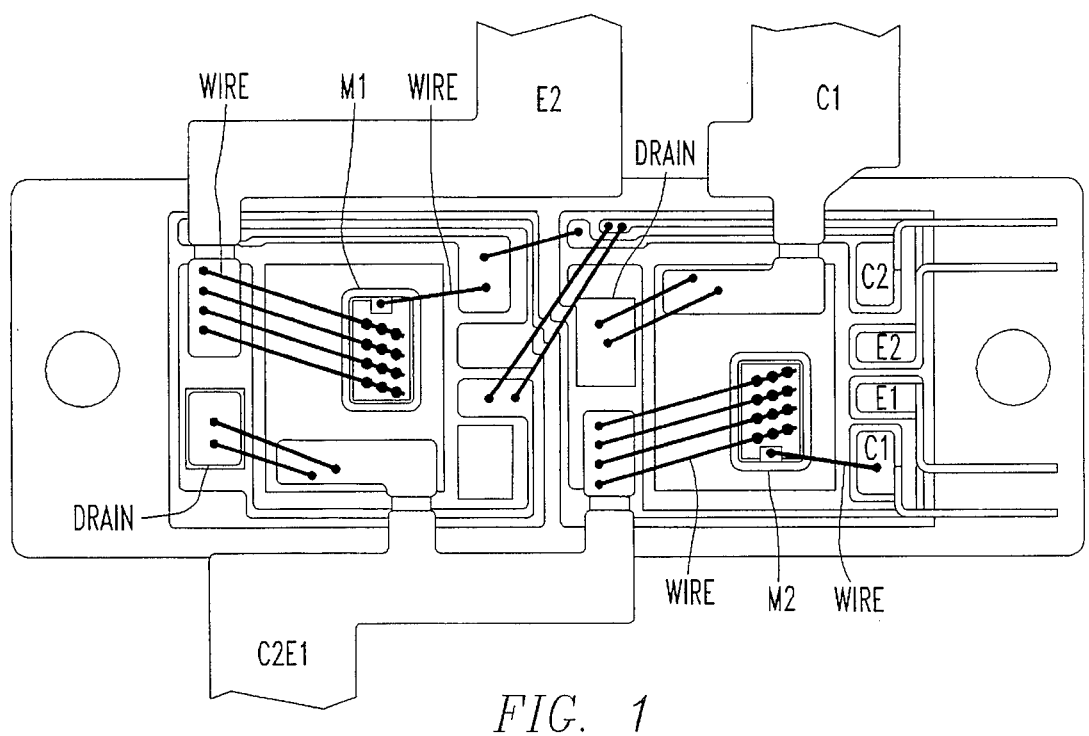
FIG. 1 diagrammatically illustrates the integrated circuit layout of a conventional dual power MOSFET circuit layout.
Figure 2:
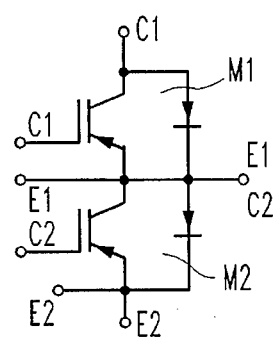
FIG. 2 is a schematic equivalent of the dual power MOSFET circuit layout of FIG. 1.
Figure 3:
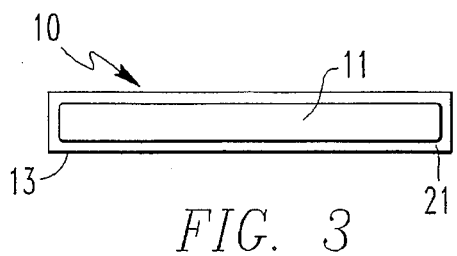
FIGS. 3–11 are various diagrammatic top, side and end views of a parallel terminal lead, inductance reducing configuration of the present invention for an integrated circuit layout, such as a power MOSFET circuit device.
Figure 4:
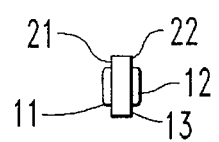

More particularly, FIGS. 3 and 4 show respective top and end views of a mounting and support structure 10 for the source and drain leads as comprising generally flat, stripe-shaped conductors, such as copper layer 11 and 12, bonded to, deposited on, or otherwise formed on opposite sides 21 and 22 of a thin narrow stripe-shaped layer 13 of insulating material, such as ceramic. As can be seen in FIG. 3, conductors 11 and 12 form substantially identical vertical geometry projections upon one another through insulating stripe 13. As a consequence, forward and return current through flat conductors 11 and 12 are in close proximity with each other, which serves to cancel magnetic flux linkage therebetween and thus reduces the effective inductance of the source and drain conductors.

Figure 5:
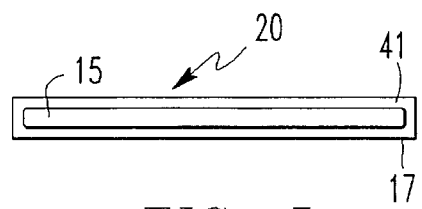
Figure 6:
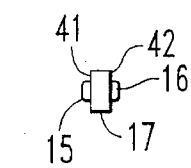

FIGS. 5 and 6 are similar to FIGS. 3 and 4, respectively showing top and end views of a mounting and support structure 20 for the gate and source Kelvin leads 15 and 16. Namely, these leads are also formed of generally flat, stripe-shaped conductors, such as copper layer, that are bonded to, deposited on, or otherwise formed on opposite sides 41 and 42 of a thin narrow stripe-shaped layer 17 of insulating material, such as a layer of ceramic material, as previously described. As shown in FIG. 5, gate and source Kelvin leads yield substantially identical vertical geometry projections upon one another through ceramic stripe 17, so that forward and return current through these conductors are sufficiently close to one another, that they cancel magnetic flux linkage therebetween and thereby reduce the effective inductance of the gate and source Kelvin conductors.

Figure 7:
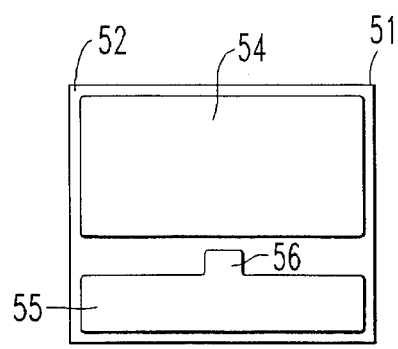
Figure 8:
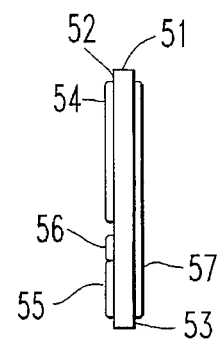

FIGS. 7 and 8 show respective plan and end views of a generally flat or planar surfaced ceramic substrate 51, to which each of the source/drain and gate/source Kelvin conductor structures 10 and 20 of FIGS. 3–6 is mounted.

Figure 9:
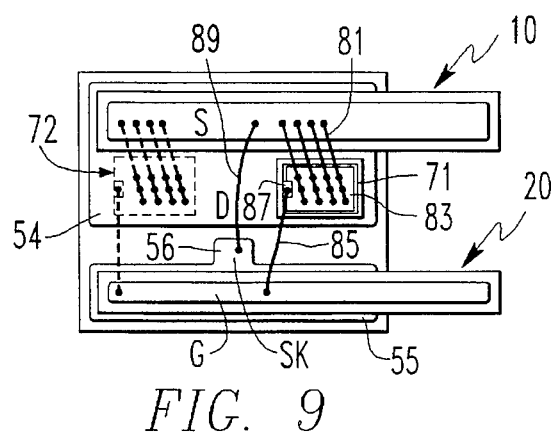
Figure 11:
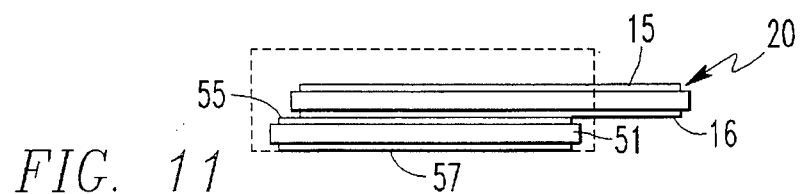

FIGS. 9 and 11 are respective plan and sideviews of the parallel terminal lead, inductance reducing configuration of the present invention, showing the manner in which the parallel back conductor structures 10 and 20 extend beyond an edge of the substrate 51, so that the terminal connection geometry is maintained in a flat, parallel configuration. As a consequence, for each conductor pair of the respective laminate structures 10 and 20, currents therethrough are parallel and in opposite flow path directions, whereby the flux lines of magnetic fields created by these currents mutually cancel each other. What results is a reduced effective inductance coupling therebetween, thereby significantly reducing the previously described problems of unwanted coupling, feedback and noise sensitivity among the source, drain and gate leads 11, 12 and 15, respectively. Substrate 51 has a first generally planar surface 52 upon which spaced apart conductor (e.g. copper) plate layers 54 and 55 are formed. Conductor plate layer 54, which is to serve as a drain electrode connection layer, is shown as being generally rectangular. Similarly, conductor plate layer 55, which is to serve as a source Kelvin electrode connection layer, is shown as being generally rectangular and having a projection region 56. On the opposite planar side 53 of substrate 51 a substantially continuous layer of conductor 57 (e.g. copper) is formed.

Figure 10:
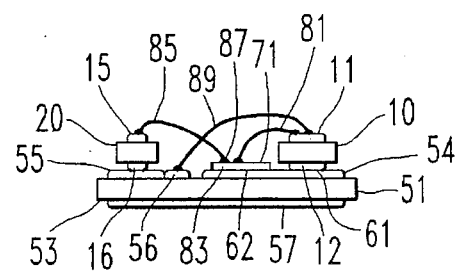

The laminate structure 20 of FIGS. 5 and 6 of the flat gate conductor 15, thin insulating stripe 17 and source Kelvin conductor 16 is mounted atop source Kelvin conductor plate layer 55, such that source Kelvin conductor 16 is bonded directly to plate 55, as shown in the plan view of FIG. 9 and the respective end and side views of FIGS. 10 and 11. The laminate structure of FIGS. 3 and 4 of the flat source conductor 11, thin insulating stripe 13 and drain conductor 12 is mounted to drain conductor plate layer 54, such that drain conductor 12 is bonded directly to a first surface portion 61 of conductor plate layer 54, that leaves a second surface portion 62 of conductor plate layer 54 for placement of one or more MOSFET die directly upon drain conductor plate layer 54. In order to avoid unnecessary cluttering of the drawings, a single device die is shown at 71; it should be observed, however, that the structure may include one or more additional die, such as shown in broken lines at 72. Electrical connections for these additional die are provided in the same manner as those for device die 71, to be described.

In order to electrically connect the source region of the one or more MOSFET devices, such as device 71, to the source conductor 11 of the source/drain structure 10, one and preferably a plurality of ohmic wires 81 may be directly (stitch) bonded to the source terminal region 83 of the MOSFET device 71 and to source electrode layer 11. Electrical connection of drain region of device 71 to the drain conductor 12 of the source/drain structure 10 is effected by direct electrical and mechanical (bonding) attachment of drain electrode on the bottom of the die 71 to drain plate layer 54.

To connect the gate of device 71 to the flat gate conductor 15 of the gate/source Kelvin structure 20, an ohmic wire 85 may be directly bonded to the gate 87 of the MOSFET device 71 and to gate electrode layer 15. Finally, connection between the source Kelvin electrode 16 to the source of device 71 is effected by bonding an ohmic wire 89 between the projection region 56 of plate layer 55 and the source electrode layer 11 of mounting structure 10, as shown.

As can be seen the conductor lead arrangement of FIGS. 3–11, by configuring the source/drain conductor leads and the gate/source Kelvin conductor leads as 'vertically' parallel structures, for each conductor pair currents therethrough are parallel and in opposite flow path directions, so that the flux lines of magnetic fields created by such currents mutually cancel each other flux, thereby reducing the effective inductance coupling therebetween, thereby significantly reducing the above-described problems of unwanted coupling, feedback and noise sensitivity among the source, drain and gate leads.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. An integrated circuit mounting and terminal connection structure comprising:

a support substrate having a first generally flat surface;

a first generally flat conductor layer disposed on a first portion of said first generally flat surface of said support substrate;

a first insulator layer having first and second generally parallel opposite surfaces upon which first and second generally flat conductive terminal leads are respectively formed in mutually overlying and parallel relationship, and being disposed on said first generally flat conductor layer so that said first and second generally parallel surfaces of said first insulator layer are parallel to said first generally flat conductor layer, with said first generally flat conductive terminal lead being mounted on said first generally flat conductor layer;

a circuit device mounted upon said first generally flat surface of said support substrate;

a first ohmic connection between said first generally flat conductive terminal lead and a first location of said circuit device; and a second ohmic connection between said second generally flat conductive terminal lead and a second location of said circuit device; and wherein entireties of said first insulator layer and said first and second generally flat conductive terminal leads are in said mutually overlying and parallel relationship, and wherein said first insulator layer and said first and second generally flat conductive terminal leads extend beyond an edge of said support substrate, maintaining current flow paths therethrough that are parallel to one another and parallel to said first generally flat surface of said substrate, so as to cancel magnetic flux linkage therebetween.

2. An integrated circuit mounting and terminal connection structure according to claim 1, further including:

a second generally flat conductor layer disposed on a second portion of said first generally flat surface of said support substrate spaced apart from said first generally flat conductor layer;

a second insulator layer having first and second generally parallel surfaces upon which third and fourth generally flat conductive terminal leads are respectively formed in mutually overlying and parallel relationship, and being disposed on said second generally flat conductor layer so that said first and second generally parallel surfaces of said second insulator layer are parallel to said second generally flat conductor layer, with said third generally flat conductive terminal lead being mounted on said second generally flat conductor layer; and a third ohmic connection between said fourth generally flat conductive terminal lead and a third location of said circuit device; and wherein entireties of said second insulator layer and said third and fourth generally flat conductive terminal leads are in said mutually overlying and parallel relationship, and wherein said second insulator layer and said third and fourth generally flat conductive terminal leads extend beyond an edge of said support substrate, maintaining current flow paths therethrough that are parallel to one another and parallel to said first generally flat surface of said substrate so as to cancel magnetic flux linkage therebetween.

3. An integrated circuit mounting and terminal connection structure according to claim 2, wherein said second insulator layer and said third and fourth generally flat conductive terminal leads are parallel to said first insulator layer and said first and second generally flat conductive terminal leads.

4. An integrated circuit mounting and terminal connection structure according to claim 3, wherein said first insulator layer and said first and second generally flat conductive terminal leads, respectively formed on the generally parallel opposite surfaces of said first insulator layer, and said second insulator layer and said third and fourth generally flat conductive terminal leads, respectively formed on the generally parallel opposite surfaces of said second insulator layer are stripe shaped.

5. An integrated circuit mounting and terminal connection structure according to claim 2, further including a fourth ohmic connection between said third generally flat conductive terminal lead and said second generally flat conductive terminal lead.

6. An integrated circuit mounting and terminal connection structure according to claim 5, wherein said second, third and fourth ohmic connections comprise wire bond connections.

7. An integrated circuit mounting and terminal connection structure according to claim 2, wherein said circuit device comprises a MOSFET device, and wherein said first location of said circuit device corresponds to a drain region of said MOSFET device and said second location of said circuit device corresponds to a source region of said MOSFET device.

8. An integrated circuit mounting and terminal connection structure according to claim 7, wherein said third location of said circuit device corresponds to a gate of said MOSFET device.

9. An integrated circuit mounting and terminal connection structure according to claim 8, wherein said third generally flat conductive terminal lead corresponds to a source Kelvin layer.

10. An integrated circuit mounting and terminal connection structure according to claim 9, wherein said support substrate has a second generally flat surface parallel to said first generally flat surface thereof, and upon which a further conductive layer is formed.

11. A power MOSFET structure comprising:

a support substrate having a first generally flat surface;

a MOSFET circuit device having a source electrode, a drain electrode and a gate electrode, supported at a first surface portion of said first generally flat surface of said support substrate;

a first laminate terminal lead support structure comprising a first generally flat terminal lead and a second generally flat terminal lead, entireties of which are arranged in mutually overlying and insulated, parallel relationship to one another on opposite sides of a first thin layer of insulating material, supported at a second surface portion of said first generally flat surface of said support substrate, adjacent to said first portion of said first generally flat surface of said support substrate;

a second laminate terminal lead support structure comprising a third generally flat terminal lead and a fourth generally flat terminal lead, entireties of which are arranged in mutually overlying and insulated, parallel relationship to one another on opposite sides of a second thin layer of insulating material, supported at a third surface portion of said first generally flat surface of said support substrate, adjacent to said first portion of said first generally flat surface of said support substrate;

a first ohmic connection between said first generally flat terminal lead and said drain electrode of said MOSFET circuit device;

a second ohmic connection between said second generally flat terminal lead and said source electrode of said MOSFET circuit device;

a third ohmic connection between said third generally flat terminal lead and said source electrode of said MOSFET circuit device; and a fourth ohmic connection between said fourth generally flat terminal lead and said gate electrode of said MOSFET circuit device; and wherein said first laminate terminal lead support structure extends beyond an edge of said support substrate, maintaining current flow paths through said first generally flat terminal lead and said second generally flat terminal lead that are parallel to one another and parallel to said first generally flat surface of said substrate, so as to cancel magnetic flux linkage therebetween; and wherein said second laminate terminal lead support structure extends beyond said edge of said support substrate, maintaining current flow paths through said third generally flat terminal lead and said fourth generally flat terminal lead that are parallel to one another and parallel to said first generally flat surface of said substrate, so as to cancel magnetic flux linkage therebetween.

12. A power MOSFET structure according to claim 11, wherein selected ones of said second, third and fourth ohmic connections comprise ohmic wire connections.

13. A power MOSFET structure according to claim 11, wherein said third generally flat terminal lead comprises a source Kelvin conductor layer.

14. A power MOSFET structure according to claim 11, wherein said second surface portion of said first generally flat surface of said support substrate has a first electrode layer formed thereon, and wherein said first laminate terminal lead support structure is attached to said second surface portion of said first generally flat surface of said support substrate, such that said first generally flat terminal lead is disposed upon and is ohmically connected to said first electrode layer, said first electrode layer being ohmically connected to said drain electrode of said circuit device, and wherein said third surface portion of said first generally flat surface of said support substrate has a second electrode layer formed thereon, and wherein said second laminate terminal lead support structure is attached to said third surface portion of said first generally flat surface of said support substrate, such that said third generally flat terminal lead is disposed upon and is ohmically connected to said second electrode layer, said second electrode layer being ohmically connected to said second generally flat terminal lead.

15. A power MOSFET structure according to claim 14, wherein said first thin layer of insulating material and said first and second generally flat conductive terminal leads, respectively formed on the generally parallel opposite surfaces of said first thin layer of insulating material, and said second thin layer of insulating material and said third and fourth generally flat conductive terminal leads, respectively formed on the generally parallel opposite surfaces of said second thin layer of insulating material are stripe shaped.

* * * * *